(12) United States Patent
Zhu

(10) Patent No.: US 7,075,301 B2
(45) Date of Patent: Jul. 11, 2006

(54) METHOD AND APPARATUS TO REDUCE RF POWER DEPOSITION DURING MR DATA ACQUISITION

(75) Inventor: Yudong Zhu, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/057,257

(22) Filed: Feb. 14, 2005

(65) Prior Publication Data
US 2005/0134267 A1  Jun. 23, 2005

Related U.S. Application Data

(63) Continuation of application No. 10/723,311, filed on Nov. 26, 2003, now Pat. No. 6,989,673.

(51) Int. Cl.
*G01V 3/00* (2006.01)

(52) U.S. Cl. ...................... 324/318; 324/309

(58) Field of Classification Search ............... 324/318, 324/319, 322, 309, 307, 300; 600/410
See application file for complete search history.

(56) References Cited

U.S. PATENT DOCUMENTS

| | | | | |
|---|---|---|---|---|
| 4,689,563 A | 8/1987 | Bottomley et al. | ......... | 324/318 |
| 4,782,298 A | 11/1988 | Arakawa et al. | ............ | 324/318 |
| 5,349,296 A | 9/1994 | Cikotte et al. | .............. | 324/318 |
| 5,758,646 A | 6/1998 | Van Der Meulen et al. | | 324/309 |
| 6,242,919 B1 | 6/2001 | Zuk et al. | ..................... | 324/319 |
| 6,411,090 B1* | 6/2002 | Boskamp | ..................... | 324/318 |
| 6,636,038 B1 | 10/2003 | Heid | .......................... | 324/318 |
| 6,801,037 B1 | 10/2004 | Zhang | ........................ | 324/309 |
| 6,828,790 B1* | 12/2004 | Katscher et al. | ............ | 324/318 |
| 6,879,158 B1* | 4/2005 | Zhu | .......................... | 324/318 |
| 6,888,350 B1* | 5/2005 | Deimling | .................... | 324/309 |
| 2004/0164737 A1* | 8/2004 | Feiweier | ..................... | 324/309 |

OTHER PUBLICATIONS

Hayes, C.E. et al., An efficient, highly homogneous radiofrequency coil for whole-body NMR imaging at 1.5T, Journal of Magnetic Resonance, 1985, vol. 63, pp. 622-628.
Glover, G.H. et al., Comparison of linear and cirular polarization for magnetic resonance imaging, Journal of Magnetic Resonance, 1985, vol. 64, pp. 255-270.

(Continued)

*Primary Examiner*—Brij B. Shrivastav
(74) *Attorney, Agent, or Firm*—Ziolkowski Patent Solutions Group, SC

(57) ABSTRACT

A system composed of multiple transmit coils with corresponding RF pulse synthesizers and amplifiers is disclosed. A method of designing RF pulses specific to each transmit coil to dynamically control RF power deposition across an imaging volume is also disclosed, where parallel excitation with the transmit coils allows for management of RF power deposition on a subject while facilitating faithful production of a desired excitation profile. The present invention also supports reduction in scan time and is applicable to any coil array geometry.

20 Claims, 7 Drawing Sheets

OTHER PUBLICATIONS

Silver, M.S. et al., Selective spin inversion in nuclear magnetic resonance and coherent optics through an exact solution of the Bloch-Riccati equation, Physical Revision A, 1985, vol. 31, pp. 2753-2755.

Conolly, S. et al., A selective adiabatic spin-echo pulse, Journal of Magnetic Resonance, 1985, vol. 83, pp. 324-334.

Foo, T.K.F. et al., Reduction of RF penetration effects in high field imaging, Magnetic Resonance in Medicine, 1992, vol. 23, pp. 287-301.

Vaughan, J.T. et al., High frequency volume coils for clincial NMR imaging and spectroscopy, Magnetic Resonance in Medicine, 1994, vol. 32, pp. 206-218.

Alsop, D.C. et al., A spiral volume coil for improved RF field homogeneity at high static magnetic field strength, Magnetic Resonance in Medicine, 1998, vol. 40, pp. 49-54.

Duensing, G.R. et al., Transceive phased array desgined for imaging at 3.0T, Proceedings of the ISMRM 6th Scientific Meeting, 1998, p. 441.

Ibrahim, T.S. et al., Effect of RF coil excitation on field inhomogeneity at ultra high fields: a field optimized TEM resonator, Magnetic Resonance Imaging, 2001, vol. 19, pp. 1139-1347.

Pauly, J. et al., A linear class of large-tip-angle selective excitation pulses, Journal of Magnetic Resonance, 1989, vol. 82, pp. 571-587.

Conolly, S. et al., A reduced power selective adiabatic spin-echo pulse sequence, Magnetic Resonance in Medicine, 1991, vol. 18 pp. 28-38.

Pruessmann, K.P. et al., SENSE: sensitvity encoding for fast, MRI, Magnetic Resonance in Medicine, 1999, vol. 42, pp. 952-962.

Sodickson, D.K. et al., Simultaneous acquistion of spatial harmonics (SMASH): fast imaging with radiofrequency coil arrays, Magnetic Resonance in Medicine, 1997, vol. 38, pp. 591-603.

Pauly, J. et al., A k-space analysis of small-tip-angle excitation, Journal of Magnetic Resonance, 1989, vol. 81, pp. 43-56.

* cited by examiner

METHOD AND APPARATUS TO REDUCE RF POWER DEPOSITION DURING MR DATA ACQUISITION

CROSS-REFERENCE TO RELATED APPLICATION

The present invention is a continuation and claims priority of U.S. patent application Ser. No. 10/723,311 filed Nov. 26, 2003 U.S. Pat. No. 6,989,673, the disclosure of which is incorporated herein.

BACKGROUND OF THE INVENTION

The present invention relates generally to MR imaging and, more particularly, to a method and apparatus of parallel excitation by a transmit coil array to realize a desired excitation profile. The present invention further relates to a parallel excitation pulse design method that accounts for mutual coupling between coils of the coil array and applies to any coil geometry. The present invention is further directed to targeted RF excitation across an imaging volume to reduce RF power deposition on a subject.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Spatially selective excitation is widely used in MR imaging to induce transverse magnetization while limiting the size of the signal-contributing volume. Slice-selective excitation, the most commonly used, confines the signal-contributing volume to a fixed slice that simplifies spatial encoding during signal acquisition to reduce data acquisition or scan time. Multi-dimensional excitation that produces localization along more than one dimension has been used to further this reduction in scan time. For example, localized spectroscopy, reduced-FOV scan of a region of interest, imaging of a target anatomy of unique shape, and echo planar imaging (EPI) with a shortened echo train length are applications usually implemented because of their support of reduced scan times. In addition, profile (flip, phase and frequency) control across a sizeable volume with selective excitation has been exploited to improve excitation profile fidelity in the presence of $B_0$ inhomogeneity or gradient non-linearity, and to reduce susceptibility artifacts.

Selective excitation is commonly implemented with a single transmit coil that transmits across an entire volume and produces a relatively uniform $B_1$ field, e.g., a birdcage coil. Highly efficient pulse algorithms have been developed for designing excitation pulses that suit such a configuration.

Notwithstanding the advantages achieved by these pulse design tools, technical difficulties remain. Issues with excitation pulse duration, excitation profile accuracy, and RF power absorption (SAR) represent some of the outstanding challenges in a variety of applications. Compared to 1D excitation, flexible profile control along multiple dimensions with 2D or 3D excitation entails intensified pulsing activity and often requires powerful gradients to keep pulse duration in check. This limitation hinders applications of multi-dimensional excitation on scanners with general-purpose gradients. Substantial subject-dependency of $B_1$ field, resulting from increased wave behavior and source-subject interaction at high frequencies, may also contribute to the difficulty of excitation profile control. An elevated rate of RF power deposition at high frequencies represents yet another factor that has a significant impact on the design and application of RF transmit modules and/or excitation pulses.

It would therefore be desirable to have a system and method capable of realizing desired excitation profiles and reducing RF power deposition by the means of a parallel transmit element architecture.

BRIEF DESCRIPTION OF THE INVENTION

The present invention provides a system and method of independently controlling transmit coils of a transmit coil array to conduct RF excitation in an imaging volume that overcomes the aforementioned drawbacks.

The present invention is directed to the acceleration of multi-dimensional excitation and control of SAR through the orchestrated driving of multiple transmit coils. The present invention emphasizes the coordination of multiple transmit elements to effect appropriate $B_1$ spatiotemporal variations in a composite $B_1$ field in order to effectively manage RF power absorption and multi-dimensional pulse length while facilitating faithful production of desired excitation profiles. The present invention is also directed to the design of parallel excitation pulses with spatial and spatial-frequency domain weighting.

Therefore, in accordance with one aspect, the invention is embodied in a computer program stored on a computer readable storage medium and having instructions which, when executed by a computer, cause the computer acquire a $B_1$ field map for each transmit coil of a transmit coil array and determine from the $B_1$ field maps a spatiotemporal variation of a composite $B_1$ field. The computer is further caused to generate an RF pulsing sequence tailored to each respective transmit coil such that RF power deposition during MR imaging is reduced.

According to another aspect, the present invention includes an MRI apparatus comprising a magnetic resonance imaging (MRI) system. The MRI system has a magnet to impress a polarizing magnetic field, a plurality of gradient coils positioned about the bore of the magnet to impose a magnetic field gradient, and an RF transceiver system and an RF switch controlled by a pulse module to transmit RF signals to an RF coil assembly to acquire MR images. A transmit coil array having a plurality of transmit coils is also disclosed. The apparatus also includes a computer programmed to regulate RF power deposition on a subject (SAR) during MR imaging through independent control of the plurality of transmit coils.

In accordance with another aspect of the invention, a method of MR imaging includes determining a region-of-interest within a subject and controlling RF excitation by a plurality of independent transmit coils of a transmit coil array such that RF power deposition on the subject is reduced.

Various other features, objects and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
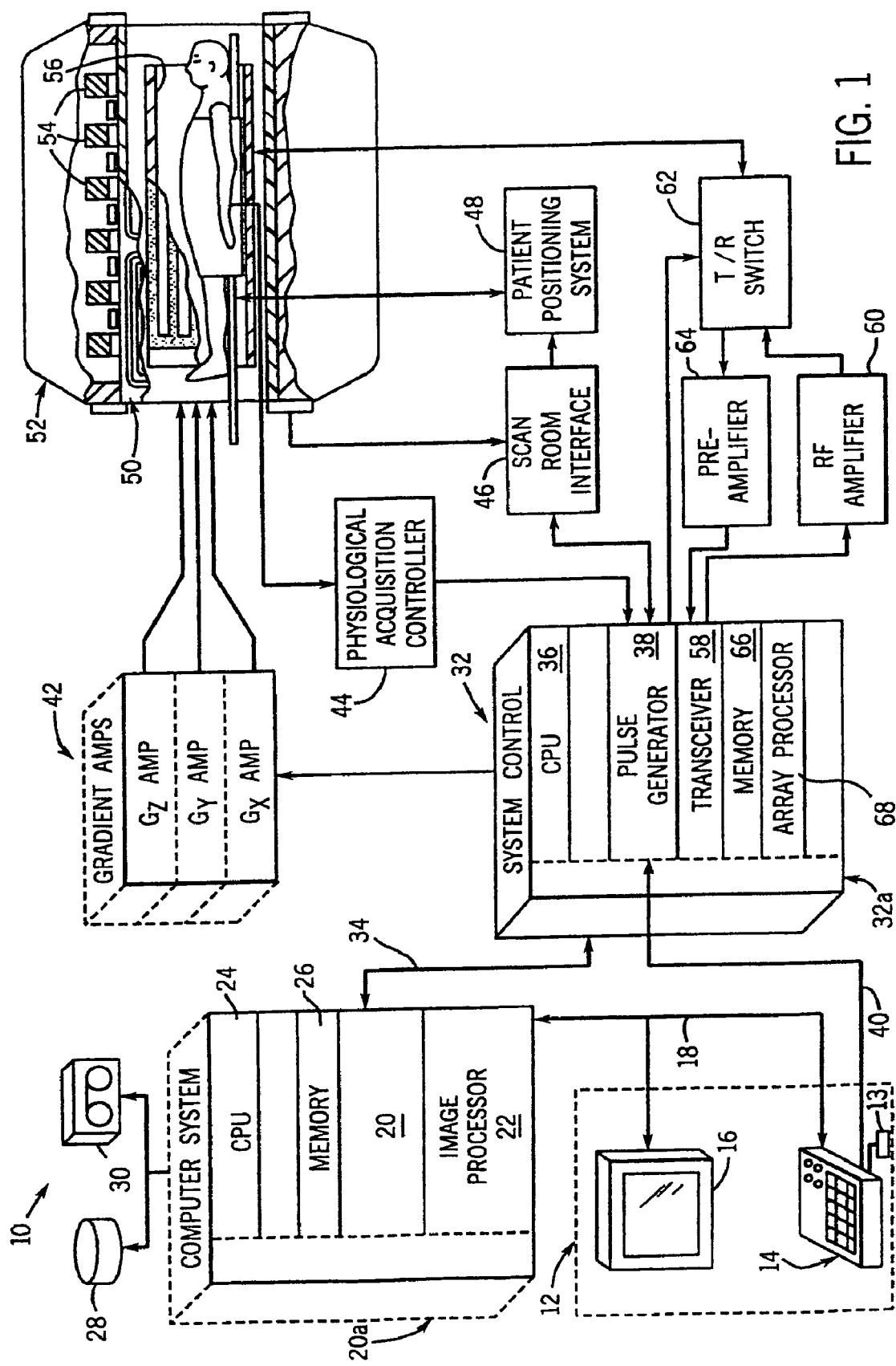
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
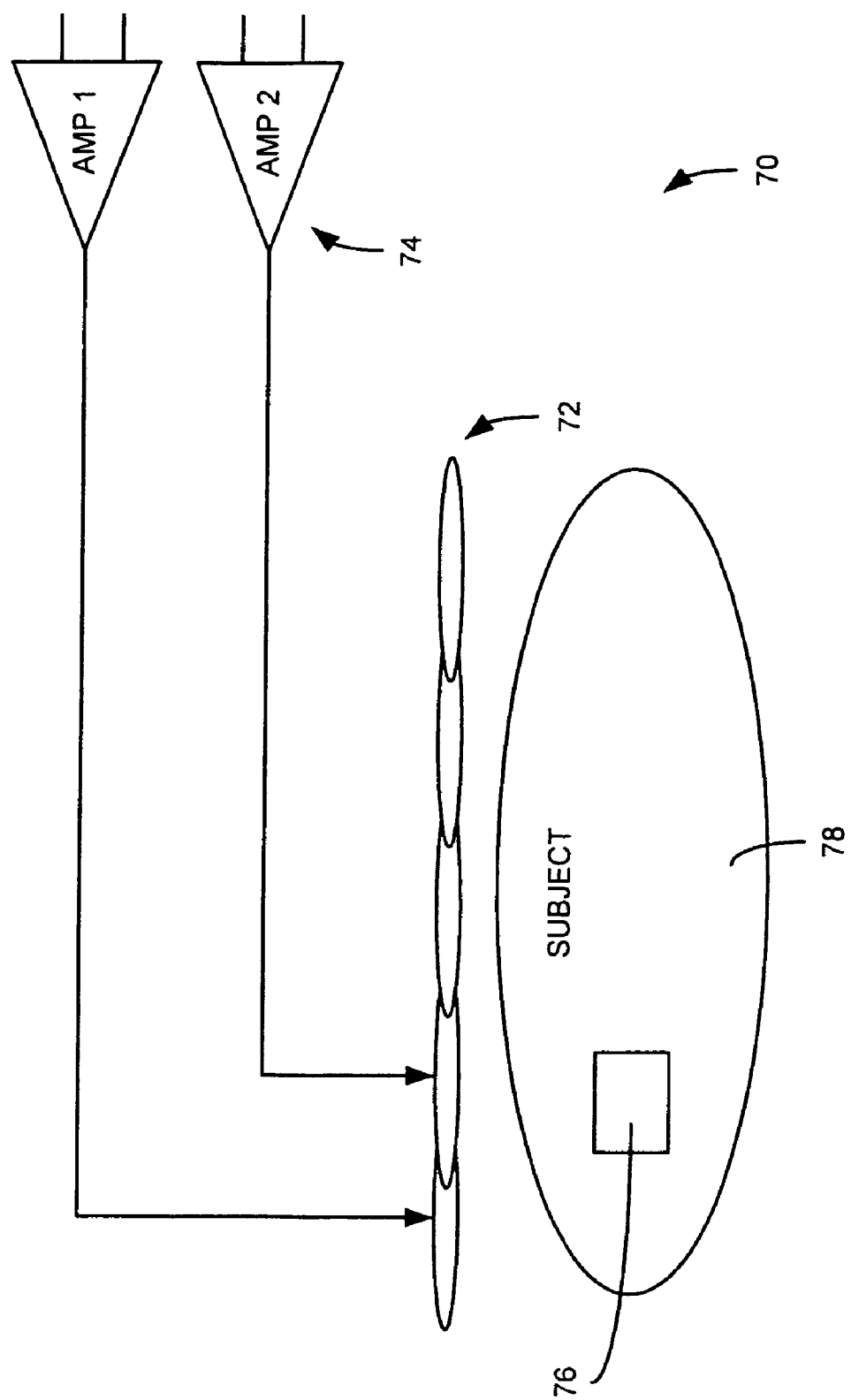
FIG. 2 is a block diagram illustrating a linear transmit coil array assembly in accordance with one aspect of the present invention.

The present invention is directed to a method and system of accelerating RF pulse transmission by a plurality of transmit coils. Such a transmit coil array is illustrated in FIG. 2. Transmit coil array assembly 70 includes a plurality of RF coils or elements 72 that are designed for parallel RF transmission, and a plurality of RF amplifiers 74. In one preferred embodiment, each transmit coil 72 is driven by a dedicated RF amplifier 74. In this regard, each RF amplifier is configured to generate a controlled current in a respective RF coil for defining and steering an excitation volume 76 of a subject 78 within an MRI system. As will also be described, each of the transmit coils is controlled in a manner such that inter-coil correlations, i.e. mutual coupling, are taken into account. As illustrated in FIG. 2, the transmit coils 72 are arranged in a substantially linear fashion. Additionally, as will be described in greater detail, the RF amplifiers provide control signals to the plurality of RF transmit coils such that induction of transverse magnetization may be localized to a particular region-of-interest so as to reduce RF power deposition on the subject. As will be further described, each of the transmit coils is controlled in a manner such that RF power deposition is further reduced.

Figure 3:
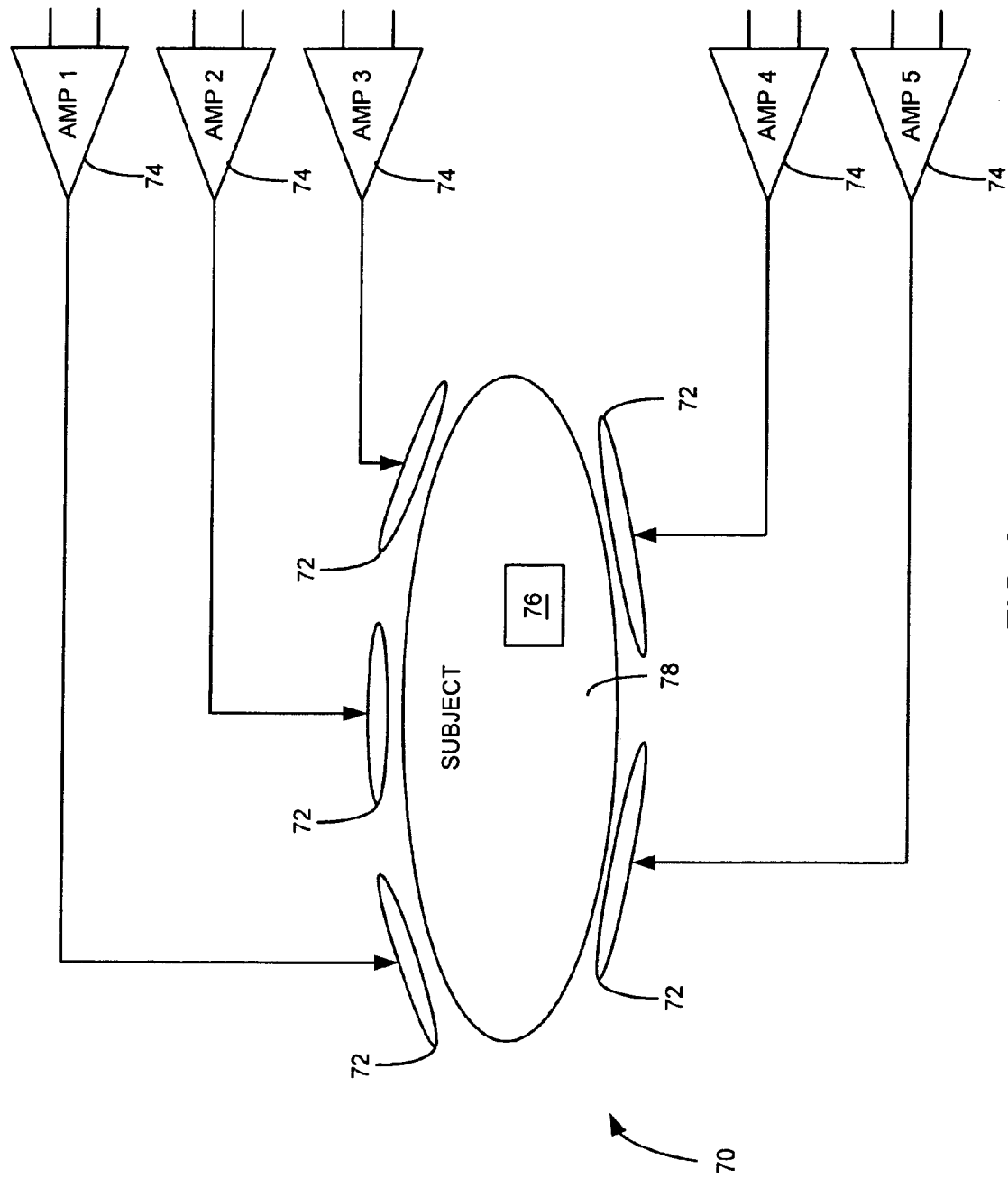
FIG. 3 is a block diagram illustrating a wrap-around transmit coil array assembly in accordance with another aspect of the present invention.

Referring now to FIG. 3, transmit coil array assembly 70 is illustrated in another embodiment. In this embodiment, the transmit coils 72 are positioned in a wrap-around manner. In this regard, the coils are arranged in a distributed manner around the subject. Similar to that shown and described with respect to FIG. 2, each RF coil 72 is connected to a dedicated RF amplifier 74. One skilled in the art will readily appreciate that FIGS. 2–3 illustrate a pair of possible arrangements of the coils of a transmit coil array and that other arrangements not specifically illustrated are possible and contemplated.

As indicated above, the present invention is directed to a method and system operable with a transmit coil array such that RF excitation by the transmit coils is carried out in parallel. This parallel excitation not only supports a reduction in scan time through the acceleration of RF pulses and the localization of targeted excitation, but also supports reduction in RF power deposition on a subject.

The present invention will be described with respect to a small-tip-angle excitation, but one skilled in the art will appreciate that the present invention is extendable to other excitation regimes. The transverse magnetization resulting from a small-tip-angle excitation with a single transmit coil may be analyzed by the Fourier transform of the k-space trajectory traversed and weighted during the excitation:

$$M(x) = j\gamma M_0(x) b(x) \int_k W(k) S(k) e^{j2\pi k \cdot x} dk \quad \text{Eqn. 1,}$$

where $S(k)$ represents a spatial-frequency sampling trajectory controlled by the switching gradients, $W(k)$, a spatial-frequency weighting induced by the driving RF source, and $b(x)$, a spatial weighting induced by the coil's $B_1$ field pattern.

When several sets of pulse synthesizers and amplifiers form parallel RF sources that simultaneously drive corresponding coils during excitation, multiple spatial-frequency and spatial weightings influence the creation of the transverse magnetization. Within the limits of the small-tip-angle approximation, the k-space perspective expressed by Eqn. 1 may be extended to analyze a parallel excitation system based on the property of linearity:

$$M(x) = j\gamma M_0(x) \sum_{n=1}^{N} b_n(x) \int_k \sum_{l=1}^{N} c_{n,l} W_l(k) S(k) e^{j2\pi k \cdot x} dk. \quad \text{Eqn. 2}$$

In Eqn. 2, N denotes the total number of transmit coils, n and l are coil indices, $c_{n,l}$ are coefficients characterizing the mutual coupling between the coils, $W_l(k)$ represent spatial-frequency weightings induced by the independently controlled RF sources, and $b_n(x)$ represent spatial weightings induced by the coils respective $B_1$ field patterns.

With $g(x)$ denoting the term in Eqn. 2 that defines the excitation profile, $g(x)$ may be expressed as $$g(x) = \sum_{l=1}^{N} \left( \sum_{n=l}^{N} c_{n,l} b_n(x) \right) \int_k W_l(k) S(k) e^{j2\pi k \cdot x} dk \quad \text{Eqn. 3}$$

$$= \sum_{l=1}^{N} \hat{b}_l(x) \int_k W_l(k) S(k) e^{j2\pi k \cdot x} dk,$$

which indicates that in the analysis of the parallel transmit system, $$\hat{b}_l(x) \equiv \sum_{n=1}^{N} c_{n,l} b_n(x),$$

the effective spatial weightings, may be used to account for coupling-induced inter-coil correlations.

As an example, a 2D excitation case is considered, where an echo planar $(k_x, k_y)$ trajectory, with $k_x$ being the slow direction and $\Delta_{kx}$ being the sampling period, is used and $\{(x,y)|x_{min} \leq x \leq x_{max}, y_{min} \leq y \leq y_{max}\}$ specifies the field-of-view that contains the subject. The k-space weighting and sampling gives rise to a 2D excitation profile, which, as defined by Eqn. 3, is a weighted superposition of N periodic functions:

$$g(x, y) = \sum_{l=1}^{N} \hat{b}_l(x, y) \sum_{m=-\infty}^{+\infty} u_l(x - m\Delta, y). \quad \text{Eqn. 4}$$

In Eqn. 4, the notation $u_l(x)$ and $\Delta$ represent, respectively, $\int W_l(k) e^{j2\pi k \cdot x} dk$ and $1/\Delta_{kx}$. Z-dependence has been suppressed for simplicity.

From Eqn. 4, it is clear that the discrete nature along $k_x$ necessarily implies aliasing lobes along x. Of significance, Eqn. 4 indicates that side lobe suppression may be achieved through multiple weighting in the spatial ($\hat{b}_l(x)$) and spatial-frequency ($W_l(k)$) domains. This can be compared to the case of excitation with a body-coil (volume coil with $b(x) \approx 1$), where a typical pulse design has the side lobes pushed outside the subject by limiting sampling period $\Delta_{kx}$ to be no greater than $1/D$ ($D = x_{max} - x_{min}$).

Within a small-tip-angle regime, design of gradient and RF pulses given a desired excitation profile may be achieved solving an inverse problem defined by Eqn. 3. For the purpose of illustration, a 2D excitation will be described.

To achieve a 2D excitation profile given by g(x,y) and with solutions of type: $u_l(x,y)=h_l(x,y)g(x,y)$, Eqn. 4 may be rewritten as:

$$g(x, y) = \sum_{m=-\infty}^{+\infty} g(x - m\Delta, y) \sum_{l=1}^{N} h_l(x - m\Delta, y)\hat{b}_l(x, y), \quad \text{Eqn. 5}$$

which in general requires, for all (x,y) inside the field-of-view, $$\sum_{l=1}^{N} h_l(x - m\Delta, y)\hat{b}_l(x, y) = \begin{cases} 1, & m = 0 \\ 0, & \text{otherwise} \end{cases}. \quad \text{Eqn. 6}$$

By sorting the equations (e.g., through change of variables), it can be shown that $\{h_l(x,y), l=1, \ldots, N\}$ is typically constrained, at each (x,y), by K linear equations (K is defined as the smallest integer that is greater or equal to D/Δ):

$$C_{(x,y)}h_{(x,y)} = e_1 \quad \text{Eqn. 7,}$$

where $$C_{(x,y)} = \begin{bmatrix} \hat{b}_1(x, y) & \hat{b}_2(x, y) & \ldots & \hat{b}_N(x, y) \\ \vdots & \vdots & & \vdots \\ \hat{b}_1(x + m\Delta, y) & \hat{b}_2(x + m\Delta, y) & \ldots & \hat{b}_N(x + m\Delta, y) \\ \vdots & \vdots & & \vdots \end{bmatrix}, \quad \text{Eqn. 8}$$

$$h_{(x,y)} = [h_1(x,y)\ h_2(x,y) \ldots h_N(x,y)]^T \quad \text{Eqn. 9,}$$

$$e_1 = [1\ 0\ \ldots]^T \quad \text{Eqn. 10,}$$

and $\{x, \ldots, x+m\Delta\ (m \neq 0), \ldots\}$ represents the set of x coordinates within the field-of-view that are evenly spaced and inter-associated due to aliasing. Employing a sampling period $\Delta_{kx}$ that is greater than 1/D, all but the first equation in Eqn. 7 represent the suppression of aliasing side lobes located within the field-of-view.

Solving Eqn. 7 repeatedly for locations throughout the field-of-view yields $h_l(x,y)$'s, which then allow the calculation of k-space weighting according to the following:

$$W_l(k) = \int_x h_l(x)g(x)e^{-j2\pi k \cdot x}dx \quad \text{Eqn. 11.}$$

The k-space weighting, and the RF pulse waveform associated with the lth coil, can thus be calculated with the Fourier transform of a spatially-weighted version of the desired excitation profile, where the spatial weighting is derived from $B_1$ field maps of each transmit coil and the k-space traversing trajectory.

Quality of $B_1$ field maps has a direct impact on excitation profile accuracy. The maps may be experimentally calibrated one at a time. With this approach, each calibration may involve an imaging experiment that uses a single element of the transmit array for transmission (with zero inputs to other elements) and the body coil for reception. A division of the result by a reference image for removing the modulation of subject contrast and additional processing for suppressing the effects of noise, then provides an estimate of the effective $B_1$ map associated with the transmit element. Alternatively, $B_1$ maps may be inferred from sensitivity maps based on the principle of reciprocity. It should be noted that multiple sensitivity maps may be calibrated in parallel to reduce calibration time. However, the opposite phase and possible changes in coil coupling characteristics between transmit and receive, if not accounted for, may compromise the accuracy of the estimated effective $B_1$ maps.

Comparing two types of systems in the 2D excitation example, the present invention provides excitation acceleration of up to N-fold over a single-channel body-coil system. Formally, this is revealed by the fact that Eqn. 7 admits at least one solution if $N \geq D/\Delta$, or equivalently, $\Delta_{kx} \leq N/D$, which is in contrast to the more stringent requirement of $\Delta_{kx} \leq 1/D$ in the case of body-coil transmission. Intuitively, the capacity for acceleration, or, reduction in excitation k-space sampling density, is probably best appreciated by recognizing that while a reduction in excitation k-space sampling density causes aliasing lobes to locate inside the subject, an appropriate design of the spatial-frequency domain weighting ($W_l(k)$) can combine with the spatial domain weighting ($\hat{b}_l(x)$) and the aliasing pattern (as determined by the sampling) to cause incoherent addition, therefore realizing reduction or annihilation of aliasing lobes' net amplitudes.

For an acceleration factor that is smaller than N, or equivalently, a sampling period that is smaller than N/D, Eqn. 7 allows a family of solutions of dimensionality N−K. This results in choices of excitation pulse designs that are all capable of producing a main lobe that matches the desired excitation profile and, when applicable, simultaneously suppressing aliasing lobes. The specific design that uses $h_l(x, y)$'s calculated by solving Eqn. 7 in the minimum norm sense is notable since it tends to lessen the sensitivity of the excitation profile to perturbations or reduces the power requirement on the RF amplifiers.

The independent driving of transmit coils of a transmit coil array also supports SAR management. Compared to uniform coverage of a subject volume with a single transmit coil, focused excitation of only the region-of-interest with an array of distributed local transmit coils by employing the coils in close proximity prevents substantial RF power deposition beyond the region. In addition, from the many ways of orchestrating the sources and achieving a desired excitation profile, the one that induces an E field with as small as possible an ensuing RF power deposition can be chosen.

While the present invention supports a number of SAR reduction techniques, i.e. focused RF excitation, SAR management with a focus on the minimization of SAR averaged over the subject volume and the excitation period, which is defined by:

$$SAR_{ave} = \frac{1}{P}\sum_{p=0}^{P-1}\frac{1}{V}\int \frac{\sigma(x)}{2\rho(x)}|E(x, p\Delta t)|^2 dv, \quad \text{Eqn. 12}$$

will be hereinafter described in greater detail. In Eqn. 12, σ denotes tissue conductivity; ρ, density; V, the size of the irradiated subject volume; and P, the total number of time points used to quantify the temporal average.

Given, for example, multiple loop coils placed facing the surface of a large slab of conducting material. At low frequencies, the fields inside the slab tend to be dominated by the incident fields, which are produced by the currents in the coils. Following a quasi-static approach in analyzing electric and magnetic near-fields, the fields may be characterized with a vector potential A:

$$A = \sum_{l=1}^{N} \frac{\mu I_l}{4\pi} \oint_{C_l} \frac{ds'}{|x-x'|},\qquad \text{Eqn. 13}$$

where the line integrals over the currents in the coils are based on filament approximation of the coil conductors, and the fields are related to A by $B=\nabla \times A$ and $E=-dA/dt$. In this case, the $|E(x,p\Delta t)|^2$ term in Eqn. 12 may be evaluated as:

$$|E(x, p\Delta t)|^2 = |-j\omega A(x, p\Delta t)|^2 \qquad \text{Eqn. 14}$$

$$= \left| \sum_{l=1}^{N} I_l(p\Delta t)\left(\frac{-j\omega\mu}{4\pi} \oint_{C_l} \frac{ds'}{|x-x'|}\right) \right|^2$$

$$= \left| \sum_{l=1}^{N} I_l(p\Delta t)\Phi_l(x) \right|^2$$

which is a quadratic form in $[I_1(p\Delta t)\ I_2(p\Delta t) \ldots I_N(p\Delta t)]$, a vector with values of the current waveforms at time $p\Delta t$. Sorting out the volume integral and temporal summation, $SAR_{ave}$ may be expressed as a quadratic function in the samples of the current waveforms:

$$SAR_{ave} = s^H F s \qquad \text{Eqn. 15,}$$

where superscript H denotes conjugate transpose, matrix F carries entries evaluated based on Eqns. 12 and 14, and vector s collects in a corresponding order a total of $N \times P$ samples of the current waveforms.

Provided that the electric field scales linearly with applied source functions, a quadratic relationship in the form of Eqn. 5 between average SAR and source function samples generally holds. In the presence of biological objects or at high frequencies however, solving Maxwell's equations is difficult and construction of the F matrix may need to rely on calibration results or direct E field measurements.

Given the dependencies of the absorption rate and transverse magnetization on the applied source functions, the determination of a set of coordinated source functions that produces the desired excitation profile while inducing minimum SAR is possible. In the small tip angle regime or its extension where a linear treatment of the Bloch equations is appropriate, closed-form solution exists for multi-dimensional excitation design, which obviates the task of searching a vast design space.

Continuing with the previously described 2D excitation example, equations of the form of Eqn. 7, which stem from the requirement of creating the desired main lobe in the subject while avoiding aliasing lobes, collectively constrain the spatial patterns of $h_l(x)$'s. Pooling these equations together thus gives the design constraints, which, in a matrix form, may be expressed as:

$$C_{all} h_{all} = e_{all} \qquad \text{Eqn. 16}$$

In Eqn. 16, $C_{all}$ is a block-diagonal matrix with $C_{(x,y)}$'s on the diagonal and zeros everywhere else, and $h_{all}$ and $e_{all}$ are vectors representing, respectively, concatenated $h_{(x,y)}$'s and $e_1$'s. If a moving sample of the weighting functions is carried out at a constant rate, the $W_l(k(t))$'s are proportional to the current waveforms. The Fourier transform relationship between the $W_l(k)$'s and the $h_l(x)$'s allows rewriting Eqn. 15 in terms of $h_{all}$:

$$SAR_{ave} = h_{all}^H V h_{all} \qquad \text{Eqn. 17.}$$

The quadratic form remains as Fourier transform defines a linear mapping from $h_l(x)$ to $W_l(k)$. A variable sample rate would only modify entries of matrix V to match gradient amplitude changes. As such, pulse design for SAR management may be achieved by minimizing a quadratic function subject to a linear constraint:

$$\text{minimize } h_{all}^H V h_{all}$$

$$\text{subject to } C_{all} h_{all} = e_{all} \qquad \text{Eqn. 18,}$$

which may be solved using well-known numerical techniques.

Design principles for small-tip-angle parallel excitation pulses such as that described above were evaluated in simulation and phantom experiments. To evaluate the design principle for accelerated multi-dimensional excitation, parallel excitation with a transmit coil array was first examined in a simulation study. The transmit array was comprised of nine identical 19.8 cm×6.4 cm loop coils that were placed on a flat form and lined up along the x-direction. This array faced a thin slab object below the array surface. 2D excitation with a desired excitation profile across the object in the form of $g(x) = g_x(x) \cdot g_z(z)$ was approached with parallel excitation pulses. In this case, use of an echo planar $k_x$–$k_z$ trajectory consisting of $k_x$=constant lines evenly spaced by $\Delta_{kx}$, the negligible y- and z-direction $B_1$ variation in the localized volume, and the separability of $g(x)$ yielded solutions to Eqn. 11 of the form $W_l(k) = U_{kx,l}(k_x) \cdot U_{kz}(k_z)$, where $$U_{kx,l}(k_x) = \int_x h_l(x) g_x(x) e^{-j2\pi k_x x} dx$$

$$U_{kz}(k_z) = \int_z g_z(z) e^{-j2\pi k_z z} dz$$

For purposes of this first experiment equations of form Eqn. 7 were constructed and weightings over $k_x$–$k_z$ were determined. RF pulse waveforms were then calculated based on Eqn. 11. As a reference, body-coil excitation pulses aimed at the same 2D localization were designed.

The design principle for accelerated excitation was further evaluated in a phantom study, which was carried out on a 1.5 Tesla MRI scanner (CVi, GE Medical Systems, Waukesha, Wis.) with a setup very similar to that of the simulation study noted above. The transmit coil array of interest was of the same geometry and placed 3 cm above a water-filled 41×19×1 $cm^3$ brick phantom. As the scanner only supported single-channel RF pulse transmission, the study examined parallel excitation indirectly, by mimicking simultaneous driving of the nine array elements through a series of nine single-channel experiments. Validity of the approach is ensured by the property of linearity in the small-tip-angle regime, which allows the prediction of the result of a parallel excitation experiment from the superposition of transverse magnetization distributions observed from single-channel excitation experiments.

Specifically, a single transmit/receive loop coil of size 19.8 cm×6.4 cm was attached to the scanner's RF interface. During the nine experiments, the coil was placed and driven one configuration at a time, each with a position and RF pulse corresponding to one of the nine elements on the virtual coil array that were desired to simulate. After completion of every transmission, the coil was immediately switched to the receive function, whereas throughout the experiments the scanner's body coil was kept detuned. 2D excitation and acquisition were carried out with a gradient echo sequence. From one experiment to another, excitation k-space traversing was kept the same (i.e., echo planar $k_x$–$k_z$ trajectory with $k_x$ being the slow direction) but the weighting (RF pulse) was changed according to the excitation pulse design. 2D acquisition produced images that mapped out the water phantom along the x and z directions (and projected along y, the normal direction of the 1 cm slab). 2D transverse magnetization distributions were quantified by removing the coils' sensitivity profiles from the images. The distributions were then superimposed to provide an estimate of the distribution resulting from the corresponding parallel excitation experiment. By the design of the study, coil coupling is not a factor. $B_1$ maps that were estimated based on Biot-Savart Law were used in both the RF pulse calculations and the sensitivity profile removal.

In another study on excitation acceleration, an all-around array geometry was examined. The array consisted of seven transmit elements that were distributed azimuthally on a wrap-around form inside a scanner's patient bore. Computer simulations evaluated 2D excitation designs that localize along both x and y dimensions. Coupling between elements was not negligible and was taken into account with a coupling matrix determined from mutual inductance calculations. The designs used the original Eqns. 7 and 11.

Effectiveness of the SAR management scheme described previously as integrated in the parallel pulse design was further evaluated. The evaluation was carried out in the same fashion as the first simulation study except for the application of parallel excitation pulses of design type defined by Eqn. 18 instead of Eqn. 7. With the calculated $h_l(x,z)$'s, Eqn. 11 gave weightings over $k_x$–$k_z$, which in turn determined RF pulse waveforms. The resulting excitation profile and average SAR were compared to that of the first simulation study.

Figure 4:
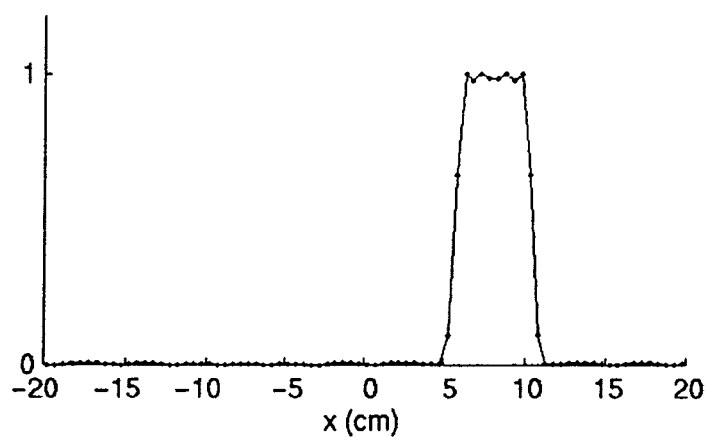
FIG. 4 is a graph illustrating an RF excitation profile achievable with a transmit coil array in accordance with the present invention.
Figure 5:
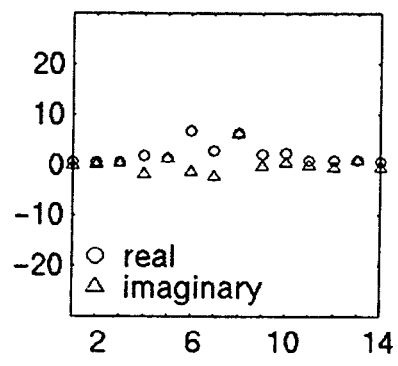
FIGS. 5–6 are plots illustrating $k_x$-direction weighting contribution by the coils of a transmit coil array positioned at two x-axis locations.
Figure 6:
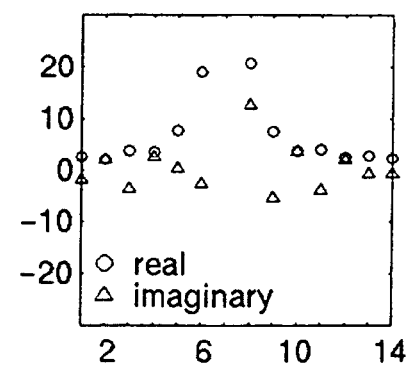
Figure 7:
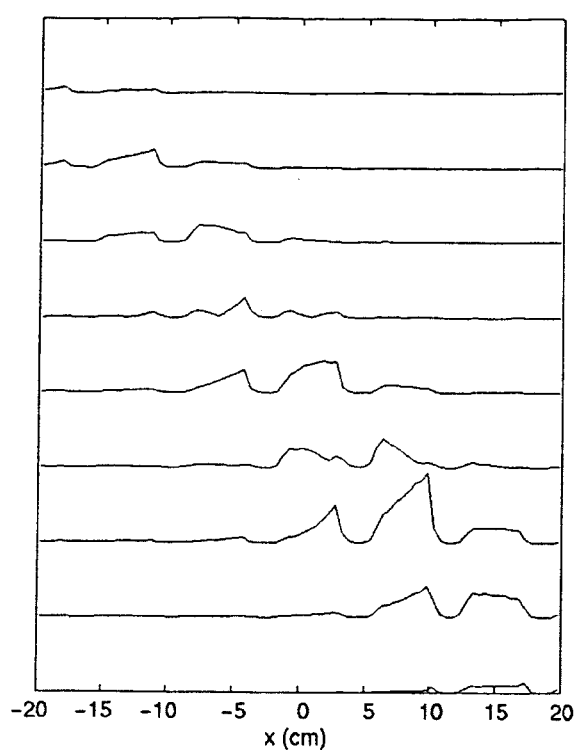
FIG. 7 illustrates the magnitude of localization profiles along the x-axis for each coil of a transmit coil array.

A discussion of the results of the above-described experiments follow. Focused excitation of a 5 cm by 5 cm region centered at x=8 cm and z=0 inside the slab object was investigated in the first simulation study. Based on a body transmit coil, a reference design employed pulses that traversed 57 $k_x$=constant lines at $\Delta_{kx}$=1/31.6 cycles/cm. The x-direction localization that resulted from this reference design is shown in FIGS. 4–7. A parallel excitation design accomplished the 2D localization task with the transmit coil array. Representing a 4-fold acceleration, the design employed pulses that traversed 14 $k_x$=constant lines at $\Delta_{kx}$=1/7 cycles/cm. $U_{kx,4}(m\Delta_{kx})$ and $U_{kx,7}(m\Delta_{kx})$, the $k_x$-direction weighting contributed by the coils positioned at x=−4 cm and x=8 cm, respectively, are illustrated in FIG. 5 and FIG. 6. Localization along x due to each of the nine coils is shown in FIG. 7. Note that while the first aliasing side lobes were 4.5 times closer to the target (center-to-center spacing=7 cm) as a result of the sampling density reduction, the net amplitudes of these as well as other aliasing lobes located inside the 40 cm FOV were negligible due to incoherent addition, as shown in FIG. 4. Compared to the result of the body-coil approach, localization of the parallel excitation was as well refocused (the imaginary component, not shown, was negligible) and of comparable spatial resolution. See FIG. 4.

Figure 9:
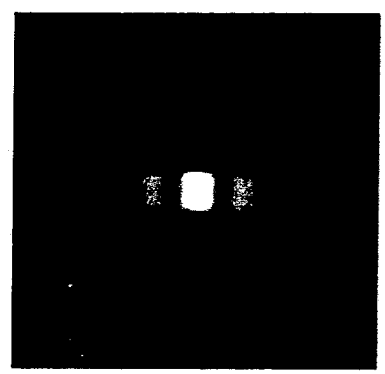
FIG. 9 illustrates resulting 2D transverse magnetization distribution as estimated by removing coil sensitivity weighting from an acquired image.
Figure 11:
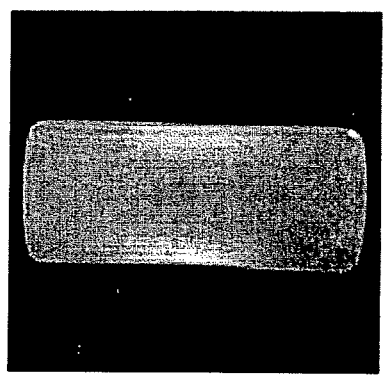
FIG. 11 illustrates transverse magnetization distribution from a non-selective excitation in a reference body coil.
Figure 8:
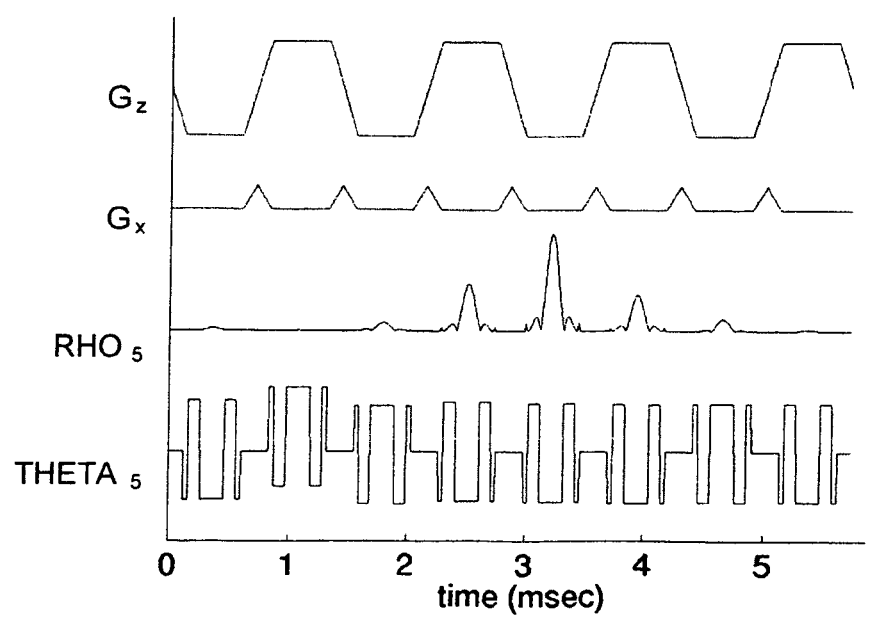
FIG. 8 graphically illustrates a pulse sequence in accordance with one aspect of the present invention.
Figure 10:
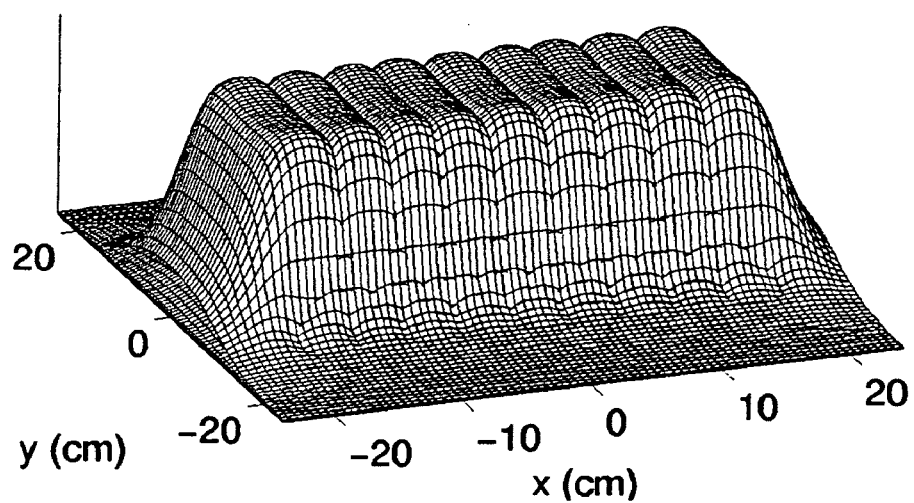
FIG. 10 illustrates $B_1$ field maps for the coils of an exemplary transmit coil array.

In the phantom study, effects of incoherent addition on aliasing side lobes were the focus of investigation. To this end, 2D excitation pulses were designed to target a region in the water phantom directly below the center element. To facilitate the investigation, pulse calculations further assumed an extended linear array instead of the 9-element one. The designed pulses were 5.7 msec in length. For the center element experiment, FIG. 8 shows the applied RF pulse (magnitude and phase) as well as $G_x$ and $G_z$, the gradient pulses identically executed in all the experiments of the series. Removing the coil's sensitivity profile from the resulting image provided an estimate of the 2D transverse magnetization distribution induced by the element, as shown in FIG. 9. FIG. 10 illustrates the $B_1$/sensitivity maps used. As a reference, FIG. 11 illustrates the transverse magnetization distribution from a nonselective excitation in a body-coil transmit-receive experiment. Noticeable in FIG. 9 is a noise amplification effect due to the division operation employed for sensitivity profile removal, which tends to increase in severity farther away from the sensitive region. To prevent excessive noise amplification from obscuring the investigation, the division operation was suppressed in distant regions.

Figure 12:
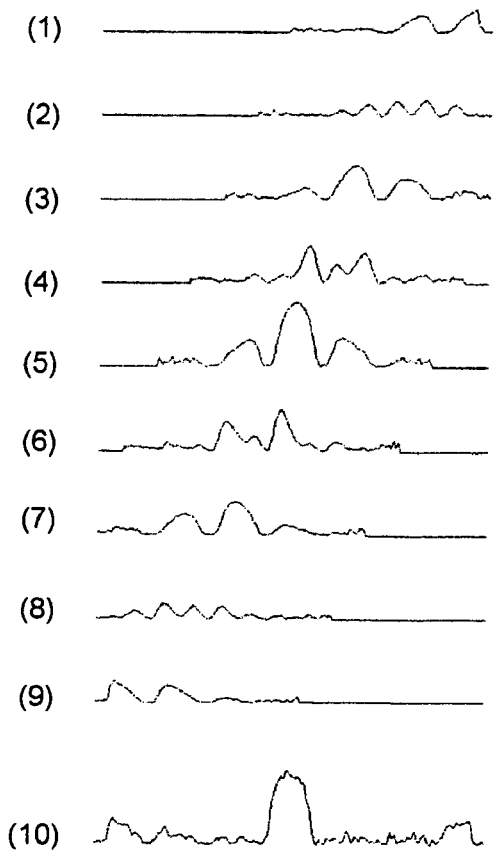
FIG. 12 illustrates $B_1$ field maps for each coil of a transmit coil array as well as a composite field map generated by superimposing the individual $B_1$ field maps.
Figure 14:
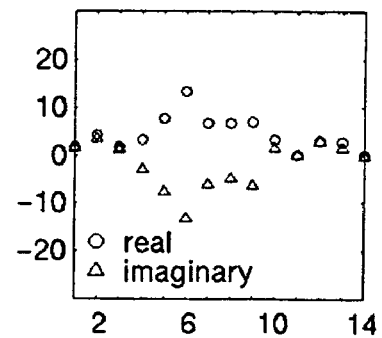
FIGS. 13–16 illustrate results of an RF pulsing protocol to control RF transmission and minimize RF power deposition on a subject in accordance with another aspect of the present invention.
Figure 15:
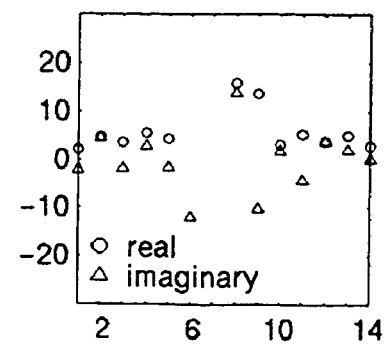
Figure 13:
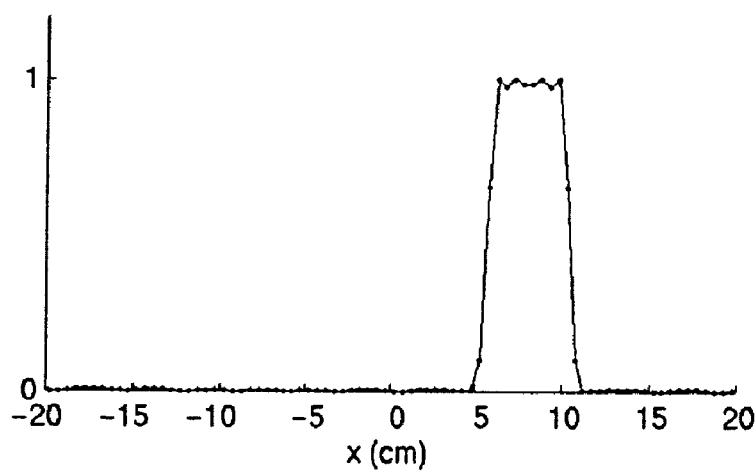
Figure 16:
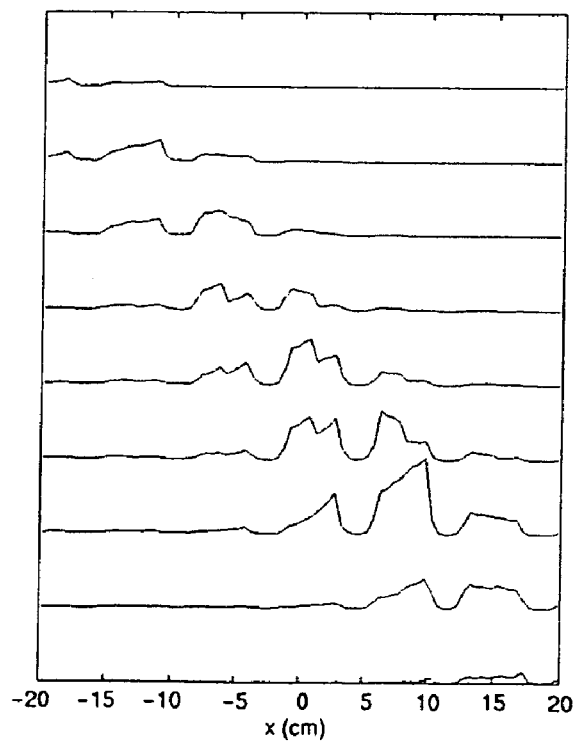

Results from all nine experiments are summarized in FIG. 12, which displays in rows 1 through 9 the mapped transverse magnetization corresponding to each of the experiments. The bottom row (row 10) presents the result of superimposing the individual maps, intended as a prediction of the result of a corresponding parallel excitation. Again, substantial reduction of aliasing side lobes due to incoherent addition was observed. With the setup, contributions from the elements in the establishment of the main lobe and the suppression of the aliasing lobes were readily appreciated. The results from the center element alone and from the middle five and middle nine elements, suggest that local excitation profile control is mainly achieved through nearby coils. Use of the extended array assumption in the pulse calculations accounted for much of the residual aliasing (incomplete annihilation) towards the 9-element array's boundary. Augmenting the array with elements beyond the nine can rectify this effect. Designing pulses for the 9-element array can rid this effect too, in which case boundary coils' weighting would experience the greatest changes.

2D parallel excitation pulses for a wrap-around array were designed and evaluated. The simulations concentrated on the task of selectively exciting an arbitrarily positioned local volume within a 40 cm-by-23 cm axial field-of-view. Eqn. 7 was solved repeatedly based on the effective $B_1$ field patterns and an EPI trajectory comprising 14 $k_x$=constant lines at $\Delta_{kx}$=1/6.9 cycles/cm. For the lth coil, l=1, 2, . . . , 7, the product of the desired 2D localization profile with the calculated $h_l(x,y)$ was then Fourier transformed to derive the coil's k-space weighting and RF pulse waveform by the parallel excitation. The net result was substantially free of aliasing side lobes and represents an excellent match to that of a reference excitation, which involved body-coil transmission of a 4-times longer conventional RF pulse.

The design of the last simulation study resulted in parallel excitation pulses that differed in shape from the pulses of the first simulation study. FIGS. 13–16 present the outcome with a format similar to that of FIGS. 4–7. While the pulses maintained the same level of localization accuracy and spatial resolution as that of the pulses of the first simulation study, FIG. 13, the design changes led to a 38% reduction in average SAR, confirming the substantial impact of the integrated SAR management scheme.

With the present invention, designed RF pulses are synthesized, amplified and fed to corresponding transmit elements in parallel to induce both spatial and temporal variations of the composite $B_1$ field, which, accompanied by appropriate gradient changes played out in synchrony, create a desired excitation profile upon completion of excitation. This is in contrast to a conventional approach, where the design of coil geometry and the offsets of driving-port phase/magnitude target $B_1$-field spatial homogeneity, and an RF pulse played during excitation is limited to manipulate $B_1$-field temporal variation only. One skilled in the art will recognize that inducing appropriate $B_1$ spatiotemporal variations for excitation bears significant ramifications on RF excitation performance. That is parallel excitation accommodates excitation acceleration and/or SAR control without substantial sacrifice in the accuracy of producing the desired excitation profile.

In summary, the RF pulse driving a transmit element can be calculated with the Fourier transform of a spatially weighted version of the desired excitation profile, the capacity for accelerating multi-dimensional excitation by the means of k-space sampling density reduction lies with the suppression of aliasing lobes and can be achieved by appropriately designed driving pulses (spatial-frequency domain weightings), and SAR management can be accomplished by minimizing a quadratic function in the driving sources, which searches a way of orchestrating the sources to achieve a desired excitation profile and/or acceleration while inducing an E field with minimum ensuing RF power deposition.

From an application perspective, fast imaging is an area where the present parallel excitation approach is particularly applicable. Under circumstances where the anatomy of interest is contained in a local region for example, multi-dimensional excitation that "spotlights" the region allows acceleration of imaging by alleviating the burden of spatial encoding inflicted on signal acquisition. Representing improvements over conventional excitations, multi-fold shorter parallel excitations support imaging volume definition/steering while breaking the time cost barrier that hindered the practical use of multi-dimensional pulses in the past. Compared to the use of a parallel acquisition approach, focused imaging based on the parallel excitation approach is not subject to the unique SNR degradation described by the geometric factor. Combined use of the two approaches is possible and can provide an even greater capacity for scan time reduction. While the experiments reported here focused on 2D localization, the parallel excitation approach applies to the creation and acceleration of general 2D excitation profiles, with utilities including correction for field imperfection-induced effects and non-Fourier spatial encoding. The present invention is also applicable to 3D acquisition.

In high field imaging, the transmit system and driving means described may be used to both manage excitation profile and regulate RF power deposition. Embodying an integrated treatment of excitation pulses and transmit coils, the present invention facilitates excitation profile control. Transmission with a distributed parallel system, acceleration of excitation and management of SAR further provides a solution to power deposition at high field strength.

Therefore, in accordance with one embodiment, the invention is embodied in a computer program stored on a computer readable storage medium and having instructions which, when executed by a computer, cause the computer acquire a $B_1$ field map for each transmit coil of a transmit coil array and determine from the $B_1$ field maps a spatiotemporal variation of a composite $B_1$ field. The computer is also caused to generate an RF pulsing sequence tailored to each respective transmit coil such that RF power deposition during imaging is reduced.

According to another aspect, the present invention includes an MRI apparatus comprising a magnetic resonance imaging (MRI) system. The MRI system has a magnet to impress a polarizing magnetic field, a plurality of gradient coils positioned about the bore of the magnet to impose a magnetic field gradient, and an RF transceiver system and an RF switch controlled by a pulse module to transmit RF signals to an RF coil assembly to acquire MR images. A transmit coil array having a plurality of transmit coils is also disclosed. The apparatus also includes a computer programmed to regulate RF power deposition on a subject (SAR) during MR imaging through independent control of the plurality of transmit coils.

In accordance with another aspect of the invention, a method of MR imaging includes determining a region-of-interest within a subject and controlling RF excitation by a plurality of independent transmit coils of a transmit coil array such that RF power deposition on the subject is reduced.

The present invention has been described in terms of the preferred embodiment, and it is recognized that equivalents, alternatives, and modifications, aside from those expressly stated, are possible and within the scope of the appending claims.

What is claimed is:

1. An MRI apparatus comprising:
   a magnetic resonance imaging (MRI) system having a magnet to impress a polarizing magnetic field, a plurality of gradient coils positioned about a bore of the magnet to induce a magnetic field gradient, a transmit coil array having a plurality of transmit coils, and an RF transceiver system and an RF switch controlled by a pulse module to transmit RF signals to an RF coil assembly to acquire MR images; and
   a computer programmed to:
      design an RF pulse waveform for each transmit coil of a plurality of transmit coils of a transmit coil array such that side lobes in a parallel RF excitation by the transmit coil array are reduced; and
      regulate RF power deposition on a subject during MR imaging through independent control of the plurality of transmit coils of the transmit coil array.

2. The MRI apparatus of claim 1 wherein the computer is further programmed to simultaneously achieve RF excitation consistent with a desired excitation profile and SAR reduction on the subject.

3. The MRI apparatus of claim 1 wherein the computer is further programmed to control RF excitation of the transmit coil array to focus RF excitation on a region-of-interest within the subject.

4. The MRI apparatus of claim 1 wherein the computer is further programmed to design an RF pulse waveform for a transmit coil based on at least an effective $B_1$ field generated by the transmit coil.

5. The MRI apparatus of claim 1 wherein the computer is further programmed to acquire 2D or 3D MR data.

6. The MRI apparatus of claim 1 wherein the plurality of transmit coils of the transmit coil array is linearly arranged.

7. The MRI apparatus of claim 1 wherein each transmit coil is driven by a dedicated RF amplifier.

8. A method of MR imaging comprising the steps of:
   determining a region-of-interest in an imaging volume;
   determining an RF pulse scheme for each transmit coil of a plurality of transmit coils of a transmit coil array based on at least an effective $B_1$ field for each transmit coil, wherein each effective $B_1$ field includes data regarding mutual coupling of the plurality of transmit coils of the transmit coil array; and
   independently controlling RF excitation by the plurality of transmit coils of the transmit coil array such that RF power deposition is reduced.

9. The method of claim 8 further comprising the step of independently controlling RF excitation by the plurality of transmit coils such that RF power absorption by a subject disposed in the imaging volume is minimized on average over the imaging volume.

10. The method of claim 9 further comprising the step of minimizing RF power deposition over the imaging volume without causing substantial deviation of a parallel RF excitation profile created by the transmit coil array from a desired excitation profile.

11. The method of claim 8 further comprising the step of minimizing RF power deposition, which embodies a principle that is applicable to any transmit coil array geometry.

12. A computer readable storage medium having a computer program stored thereon and representing a set of instructions that when executed by a computer causes the computer to:
acquire a $B_1$ field map for each transmit coil of a transmit coil array;
determine from the $B_1$ field maps a spatiotemporal variation of a composite $B_1$ field;
determine an RF pulse scheme for a transmit coil based on at least an effective $B_1$ field for the transmit coils, wherein each effective $B_1$ field reflects mutual coupling of a transmit coil and at least another transmit coil; and
generate an RF pulsing sequence tailored to a respective transmit coil such that RF power deposition during MR imaging is reduced.

13. A computer readable storage medium having a computer program stored thereon and representing a set of instructions that when executed by a computer causes the computer to:
acquire a $B_1$ field map for each transmit coil of a transmit coil array, the transmit coil array capable of having any transmit coil array geometry;
determine from the $B_1$ field maps a spatiotemporal variation of a composite $B_1$ field;
determine an RF pulse scheme for a transmit coil based on at least an effective $B_1$ field for the transmit coils, wherein each effective $B_1$ field reflects mutual coupling of a transmit coil and at least another transmit coil; and
generate an RF pulsing sequence tailored to a respective transmit coil such that RF power deposition during MR imaging is minimized.

14. A computer readable storage medium having a computer program stored thereon and representing a set of instructions that when executed by a computer causes the computer to:
acquire a $B_1$ field map for each transmit coil of a transmit coil array, the transmit coil array capable of having any transmit coil array geometry;
determine from the $B_1$ field maps a spatiotemporal variation of a composite $B_1$ field; and
generate an RF pulsing sequence tailored to a respective transmit coil such that RF power deposition across an imaging volume during MR imaging is minimized without causing substantial deviation of a RF excitation profile created by the transmit coil array from a desired excitation profile.

15. The computer readable storage medium of claim 14 wherein the set of instructions causes the computer to determine an RF pulse scheme for a transmit coil based on at least an effective $B_1$ field for the transmit coils.

16. The computer readable storage medium of claim 15 wherein each effective $B_1$ field reflects mutual coupling of a transmit coil and at least another transmit coil.

17. The computer readable storage medium of claim 14 wherein the set of instructions further causes the computer to design each pulsing sequence such that parallel RF excitation with the transmit coil array produces a result that is consistent with a desired excitation profile.

18. The computer readable storage medium of claim 14 wherein the set of instructions further causes the computer to acquire 2D or 3D MR data.

19. The computer readable storage medium of claim 14 wherein the transmit coil array includes a linearly arranged plurality of transmit coils.

20. The computer readable storage medium of claim 19 wherein each transmit coil is driven by a dedicated RF amplifier.

* * * * *